(12) United States Patent
Shibayama et al.

(10) Patent No.: US 7,229,496 B2
(45) Date of Patent: Jun. 12, 2007

(54) PROCESS FOR PRODUCING SILICON SINGLE CRYSTAL LAYER AND SILICON SINGLE CRYSTAL LAYER

(75) Inventors: Takashi Shibayama, Kishima-gun (JP); Yoshio Murakami, Saitama (JP); Takayuki Shingyoji, Saitama (JP)

(73) Assignee: Sumitomo Mitsubishi Silicon Corporation, Tokyo (JP)

( * ) Notice: Subject to any disclaimer, the term of this patent is extended or adjusted under 35 U.S.C. 154(b) by 102 days.

(21) Appl. No.: 10/506,534

(22) PCT Filed: Mar. 5, 2003

(86) PCT No.: PCT/JP03/02568

§ 371 (c)(1),
(2), (4) Date: Sep. 3, 2004

(87) PCT Pub. No.: WO03/075336

PCT Pub. Date: Sep. 12, 2003

(65) Prior Publication Data

US 2005/0153550 A1 Jul. 14, 2005

(30) Foreign Application Priority Data

Mar. 5, 2002 (JP) .............................. 2002-059182
Sep. 6, 2002 (JP) .............................. 2002-261286

(51) Int. Cl.
*C30B 15/20* (2006.01)

(52) U.S. Cl. .............................. 117/19; 117/3; 117/13; 117/20

(58) Field of Classification Search .................... 117/3, 117/13, 19, 20
See application file for complete search history.

(56) References Cited

U.S. PATENT DOCUMENTS

| 5,279,973 A | 1/1994 | Suizu |
| 5,502,010 A | 3/1996 | Nadahara et al. |

FOREIGN PATENT DOCUMENTS

| EP | 0 973 190 A2 | 1/2000 |
| JP | 64-001393 A | 1/1989 |
| JP | 11-001393 A | 1/1999 |
| JP | 11-135514 A | 5/1999 |
| JP | 2000-091342 A | 3/2000 |
| JP | 2001-044207 | 2/2001 |

*Primary Examiner*—Felisa Hiteshew
(74) *Attorney, Agent, or Firm*—Pillsbury Winthrop Shaw Pittman, LLP (57) ABSTRACT

A thermal processing operation is performed for a silicon wafer W (silicon single-crystal layer) in an atmosphere gas which is formed by a hydrogen gas or an inert gas or a mixture gas of these gases at a temperature in a range of 600° C. to 950° C. (here, the temperature should not be greater than 950° C.). By doing this, a quality of a surface of the silicon single-crystal layer is improved.

5 Claims, 8 Drawing Sheets

PROCESS FOR PRODUCING SILICON SINGLE CRYSTAL LAYER AND SILICON SINGLE CRYSTAL LAYER

This is the U.S. National Stage of International Patent Application No. PCT/JP03/02568, filed Mar. 5, 2003, which relies on the priority dates of Japanese Application No. 2002-059182, filed Mar. 5, 2002 and Japanese Application No. 2002-261286, filed Sep. 6, 2002; the contents of all of which are incorporated herein by reference in their entireties.

TECHNICAL FIELD

The present invention relates to a method for manufacturing a silicon single-crystal layer for improving a quality of a silicon single-crystal layer which is a base board for forming a device and a silicon single-crystal layer.

BACKGROUND ART

For the above silicon single-crystal layer, it is possible to name a silicon wafer which is produces by modifying an ingot of a silicon single-crystal which is grown during a pulling operation according to a CZ (Czochralski method) or a silicon single-crystal which is formed by an Epitaxial growing method on a base board.

A device is formed by forming a thin oxide film on a surface of such a silicon single-crystal layer and layering various substrates thereon by a photolithography step and an etching step, etc., in a predetermined pattern.

Here, a fine defect which is caused by a modifying operation in a production process on a surface of the silicon single-crystal layer of a silicon wafer which has been used conventionally. Such a fine defect is a damage which is caused by, for example, a machine operation such as a grinding processing operation, an incompleteness or singular point, etc which is caused by a chemical operation by a metal element in a chemical liquid.

An inventor of the present invention found a fact in that, if a cleaning operation or an etching operation is performed to a surface of the silicon single-crystal layer which has such a defect, a defect which remains on the surface is elicit; thus, a reliability (GOI: Gate Oxide Integrity) of the oxide film which is formed on the surface is reduced.

It is anticipated due to that a cleaning liquid and an etchant work on a weak region on a surface of the silicon single-crystal layer collectively; thus, such a phenomenon is evident in a case in which a member such as a hydrofluoric acid is used for the cleaning liquid and the etchant which are preferably selected.

There was a case in which a quality of a device which is formed on a surface of the silicon single-crystal layer is defective and the product yield is worsened if the silicon single-crystal layer is formed when the GOI of the silicon single-crystal layer is deteriorated by using such a cleaning liquid and the etchant.

Conventionally, there have been proposed several methods for improving a quality of a surface of the silicon single-crystal layer to which the thermal processing operation is performed in advance. For example, in a patent document 1 which is explained hereafter, an annealing processing operation it is disclosed for reducing a COP (Crystal Originated Particle) which is a defect which is caused by a crystal by performing a thermal processing operation such as an RTA processing operation for 1 to 60 seconds at a temperature 1150° C. to 1300° C. in a hydrogen gas or an argon gas atmosphere.

Also, in a patent document 2 which is explained hereafter, it is disclosed that a roughness on a surface can be improved by performing the thermal processing operation such as an RTA processing operation for 1 to 3000 seconds at a temperature 950° C. to 1150° C. in a hydrogen gas or an argon gas atmosphere.

Japanese Unexamined Patent Application, First Publication No. Hei 11-135514 (paragraph No. 0013, FIGS. 1 and 2) (Patent Document 1)

Japanese Unexamined Patent Application, First Publication No. 2000-91342 (paragraph No. 0009, FIGS. 2 and 3) (Patent Document 2)

However, the RTA processing operation is performed at a relatively high temperature such as 950° C. or higher for improving a quality of a surface of the silicon single-crystal layer. If such a high temperature thermal processing operation is performed, it is inevitable such that a metal contamination is caused by a thermal processing device (furnace) which is used for the thermal processing operation.

Also, although a micro-roughness on a surface of the silicon single-crystal layer may be improved, a background (haze) level may be deteriorated for a reflected light which is measured by a particle counter when a surface condition is examined by a particle counter (a device for examining a surface condition optically according to a reflected light from a surface of an object which is supposed to be observed).

Furthermore, in a case in which the silicon single-crystal layer is a silicon wafer which is manufactured by modifying an ingot of the silicon single-crystal which is grown while being pulled up accordingn to the CZ method such that an oxygen precipitated nuclei is disposed therein, there are disadvantages in that the oxygen precipitated nuclei disappears in the silicon single-crystal layer by performing the thermal processing operation at such a high temperature; thus, a BMD density in the silicon single-crystal layer may be reduced greatly after the thermal processing operation for the device.

Also, conventionally, a lapping operation and an etching operation are performed for a silicon wafer which is cut from a silicon ingot a thermal processing operation. After that the silicon wafer is cleaned. Furthermore, a thermal processing operation (this thermal processing operation is called a donor killer thermal processing operation (DK thermal processing operation)) is performed to the silicon wafer for approximately 30 minutes at a temperature 600° C. to 800° C. in an inert atmosphere such as a nitrogen, etc., separately from the above high temperature operation such as the RTA processing operation in order to erase a thermal donor which is caused by an oxygen which exists in this silicon single-crystal layer. After that, a grinding operation is performed.

Hoever, in such a DK processing operation, there has been a case in which a life time and a diffusion length in a minority carrier may be reduced when a remaining metal contamination diffuses in the wafer in a cleaning step after the etching operation. Furthermore, the inventors of the present invention found a fact that there is a phenomenon in that a pit is evident and the GOI is deteriorated in a later step for forming a device when a quite a few incompletenesses which are caused by a modification remain on a surface of the silicon and a cleaning operation or an etching operation is performed by various chemicals such as HF, SC1 in a later grinding step.

DISCLOSURE OF THE INVENTION

The present invention was made in consideration of the above problems. An object of the present invention is to provide a method for manufacturing a silicon single-crystal layer of which surface quality is improved and a silicon single-crystal layer which is manufacturing this manufacturing method.

Following structure is adapted in the present invention so as to solve the above problems. That is, a method for manufacturing a silicon single-crystal layer according to the present invention comprises a step for performing a thermal processing operation in which a thermal annealing operation is performed for a short period of time in an atmospheric gas which is formed by a hydrogen gas, or an inert gas, or a mixture gas of these gases in a temperature of 600° C. to 950° C.

Also, in a method for manufacturing the silicon single-crystal layer according to the present invention, a technique is adapted in which a time for performing the thermal processing operation is 1 to 300 seconds.

Also, in a method for manufacturing a silicon single-crystal layer according to the present invention, a technique is adapted in which the silicon single-crystal layer to which the thermal processing operation is performed is formed by a silicon wafer in which an agglutinate which is cut from an ingot which is formed by a perfect area [P] does not exist under condition that an area is indicated by [I] in which an interstitial silicon-type point defect exists in an ingot of the silicon single-crystal dominantly, an area is indicated as [V] in which a vacancy-type point defect exists dominantly, a perfect area is indicated by [P] in which the agglutinate of the interstitial silicon-type point defect and the agglutinate of a point defect do not exist.

Also, in a method for manufacturing a silicon single-crystal layer according to the present invention, a technique is adapted in which the thermal processing operation is performed after performing a grinding processing operation for the silicon single-crystal layer.

Also, in a method for manufacturing a silicon single-crystal layer according to the present invention, it is preferable that the thermal processing operation is performed at a temperature 600° C. to 800° C.

A silicon single-crystal layer according to the present invention is manufactured by a method for manufacturing a silicon single-crystal layer according to an aspect of the present invention of which characteristic aspect is that a quality of a surface is improved by the thermal processing operation.

A thermal processing operation is performed in a method for manufacturing a silicon single-crystal layer and the silicon single-crystal layer such that a thermal processing operation is performed to a silicon single-crystal layer in an atmospheric gas which is formed by a hydrogen ($H_2$) gas or an inert gas or a mixture gas of theses gases at a temperature of 600° C. to 950° C. Here, the temperature should not be greater than 950° C. Here, for example, an argon gas (Ar) or a nitrogen gas ($N_2$) are used for the above inert gas.

By performing the thermal processing operation in the hydrogen gas or the inert gas, or the mixture gas of theses gases in this way, an oxide film is removed from a surface of the silicon single-crystal layer. Furthermore, a silicon atom on a surface moves; thus, a defect on a surface of the silicon single-crystal layer disappears.

In this thermal processing operation, if a processing temperature is not higher than 600° C., the temperature is too low; thus, the silicon on a surface of the silicon single-crystal layer hardly moves.

On the other hand, if the processing temperature is 950° C. or higher, a metal contamination is inevitable from the thermal processing operation device which is used for the thermal processing operation. Also, a background level of the reflected light which is measured by the particle counter is deteriorated. Furthermore, the oxygen precipitated nuclei disappears in the silicon single-crystal layer by performing the thermal processing operation in a high temperature; thus, the BMD density is reduced undesirably after performing the thermal processing operation for the device.

Therefore, in a method for manufacturing the silicon single-crystal layer according to the present invention, the temperature for the thermal processing operation which is performed for the silicon single-crystal layer is 600° C. to 950° C. Here, the temperature should not be greater than 950° C.

Also, in a method for manufacturing the silicon single-crystal layer according to the present invention, a time for performing the above thermal processing operation is 1 (one) second or longer; therefore, it is possible to secure a time for moving a silicon atom on a surface of the silicon single-crystal layer by the thermal processing operation.

A time for performing this thermal processing operation is 300 seconds or shorter because it is not possible to anticipate a further improvement even though the thermal processing operation is maintained for longer time than that; thus, a productivity (throughput) may be reduced.

Here, the silicon atom on a surface of the silicon single-crystal layer can be moved easily even in a relatively low temperature thermal processing operation such as 600 to 950° C. (here, the temperature should not be greater than 950° C.) under condition that an oxide film does not exist on a surface. Therefore if the thermal processing operation is maintained for at least 1 (one) second, it is possible to nullify the defect on a surface of the silicon single-crystal layer by removing an oxygen film on a surface and moving the silicon atom.

Also, in a method for manufacturing a silicon single-crystal layer according to the present invention, it is acceptable if a silicon wafer may be used in which an agglutinate of point defect which is cut from an ingot which is formed by a perfect area [P] does not exist. In such a case, in addition to an effect for improving a defect which is caused by a modification in the present invention, a void defect does not exist which is caused by a crystal; thus, it is possible to obtain a perfect oxygen film characteristics.

Also, in a method for manufacturing a silicon single-crystal layer according to the present invention, it is acceptable if the thermal processing operation is performed after performing a grinding processing operation for the silicon single-crystal layer. In such a case, this thermal processing operation is a DK thermal processing operation; therefore, it is possible to reduce a metal contamination which diffuses during this thermal processing operation as much as possible. Also, this thermal processing operation is performed in an atmospheric gas which is formed by a hydrogen gas or an inert gas or a mixture gas of these gases in a relatively low temperature. Therefore, it is possible to improve the incompleteness on a surface which is caused by a grinding operation and manufacture the silicon single-crystal layer which has a superior surface characteristics.

Also, in a method for manufacturing a silicon single-crystal layer according to the present invention, it is acceptable if the thermal processing operation is performed at a temperature 600° C. to 800° C. In such a case, this thermal processing operation is performed in a more preferable temperature range for the DK thermal processing operation; therefore, an effect for erasing a thermal donor is high.

BEST MODE FOR CARRYING OUT THE INVENTIONS

Hereinafter, an embodiment of the present invention is explained with reference to drawings.

In the present embodiment, a silicon single-crystal layer according to the present invention is a silicon wafer which is manufactured by modifying an ingot of the silicon single-crystal which is grown by being pulled according to the CZ method. It is acceptable if the silicon single-crystal layer is formed an epitaxial growth on a base board in addition to this condition.

Figure 1:
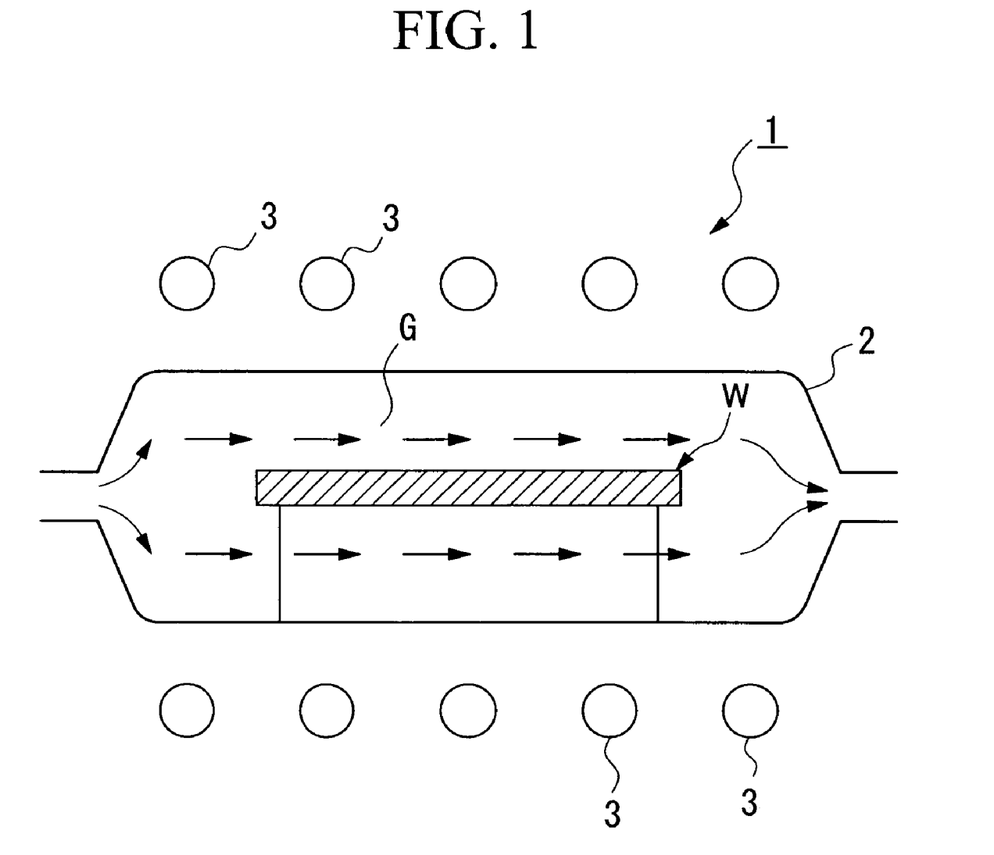
FIG. 1 is a general view for showing a method for manufacturing a silicon single-crystal layer according to the present invention.

This silicon wafer is obtained by performing a thermal processing operation to a silicon wafer W to which the RTA processing operation (annealing operation for a short period of time by a heating operation and a cooling operation) for forming new holes therein after being cut from the ingot by, for example, a thermal processing device which is shown in FIG. 1 for performing a thermal processing operation for a short period of time for a heating operation and a cooling operation.

This thermal processing device 1 in which a silicon wafer W is disposed by using a supporting member, etc., in a silica tube 2 under a separated condition from thereinside supplies an atmospheric gas G in the silica tube 2 so as to perform the thermal processing operation by emitting an infra-red ray from thereoutside by a heating lamp in which an infra-red ray lamp 3, etc. is used.

Figure 2:
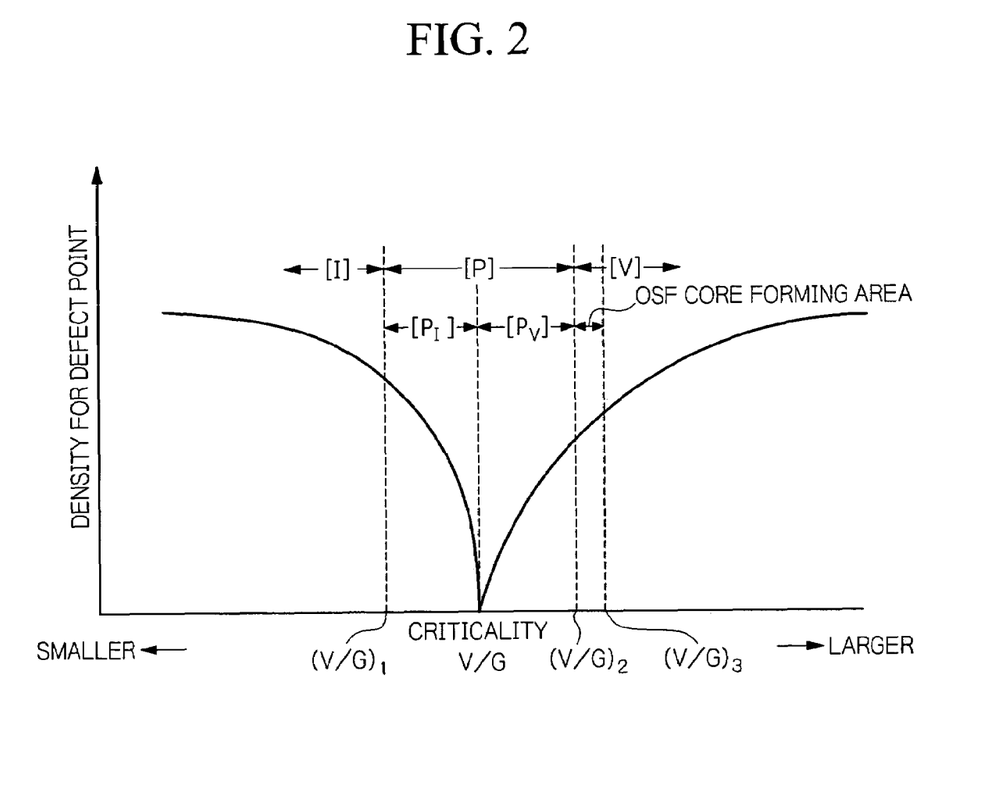
FIG. 2 is a view for showing facts according to Voronkov theory in which an ingot which has a sufficient holes under condition that V/G ratio is higher than a critical point, an ingot which has a sufficient interstitial silicon under condition that the V/G ratio is lower than the critical point, and the perfect area is greater than a first critical ratio $((V)/G)_1)$ and lower than a second critical ration $((V)/G)_2)$.

Here, in such above silicon wafer 2, as shown in FIG. 2, an agglutinate which is cut from an ingot which is formed by a perfect area [P] does not exist under condition that an area is indicated by [I] in which an interstitial silicon-type point defect exists in an ingot of the silicon single-crystal dominantly, an area is indicated as [V] in which a vacancy-type point defect exists dominantly, a perfect area is indicated by [P] in which the agglutinate of the interstitial silicon-type point defect and the agglutinate of a point defect do not exist. Here, the vacancy-type point defect is a defect which is caused by a hole which is separated from one of a normal silicon atom which has a crystal lattice. Also, the interstitial silicon point defect is a defect in which an atom exists in a point (interstitial site) except an interstitial point of the silicon crystal.

That is, the silicon wafer which is formed by this perfect area [P] is manufactured by pulling up an ingot from a melt silicon in a hot zone according to a CZ method at a pulling speed based on Voronkov theory which is proposed in Japanese Unexamined Patent Application, First Publication No. Hei 1-1393 and slicing this ingot.

This ingot is manufactured such that a value for V/G ($mm^2$/min. ° C.) should be determined such that an OSF (Oxidization Induced Stacking Fault) which is generated in a ring manner during a thermal oxidization processing operation should disappear in a central section of the wafer under condition that a pulling speed is indicated by V (mm/min.) and a temperature inclination in a vertical direction of the ingot near an interface between the melt silicon and the ingot in a melting pot is indicated by G (° C./mm).

The above Voronkov theory explains that a boarder of the hole area and the interstitial silicon area is determined by the V/G as shown in FIG. 2 in which a horizontal axis indicates V/G and a vertical axis indicates a vacancy-type point defect and a density of an interstitial silicon-type defect commonly so as to show a relationship with reference to the V/G and the density of the point defect. More specifically, an ingot is formed in which the density of the vacancy-type point defect is superior if the V/G ratio is higher than the critical point, in contrast, the density of the interstitial silicon-type point defect is superior if the V/G ratio is higher than the V/G ratio. In FIG. 1, [I] indicates an area (lower than $(V/G)_1$) in which the interstitial silicon-type point defect is dominant in which the interstitial silicon-type point defect exists. [V] indicates an area (lower than $(V/G)_2$)) in which the vacancy-type point defect is dominant in which the agglutinate of the vacancy-type point defect exists. [P] indicates a perfect area $((V/G)_1$ to $(V/G)_2$)) in which the agglutinate of the vacancy-type point defect and the agglutinate of the interstitial silicon-type point defect do not exist. An area [OSF] $((V/G)_2$ to $(V/G)_3$ for forming the OSF nuclei exists in the area [V] which is adjacent to the area [P].

Therefore, a profile for the pulling speed for the ingot which is supplied to the silicon wafer is determined such that the ratio (V/G) of the pulling speed with reference to the temperature inclination should be maintained so as to be in a range between the first critical ratio $((V/G)_1)$ for preventing a generation of the agglutinate of the interstitial silicon-type point defect and the second critical ration $((V/G)_2)$ for limiting the agglutinate of the vacancy-type point defect within an area in which the vacancy-type point defect exists dominantly when the ingot is pulled up from the melt silicon in the not zone.

The profile of the pulling speed is determined by slicing a reference ingot in an axial direction tentatively and performing a simulation according to the above Voronkov theory.

Here, there is a case in which the agglutinate of the point defect such as COP, etc., exhibit different values for a detection sensitivity and a lower limit for the detection according to a detection method. Therefore, in a specification for the present patent application, a description that "aagglutinate of a point defect does not exist" indicates such that a number of the agglutinate of the point defect is not greater than the above lower limit of the detection under condition that a lower limit for the detection is indicated by $1 \times 10^3$ pieces/cm$^3$ such that a non-stirring secco etching operation is performed to an ingot of the silicon single-crystal layer of which surface is mirror-finished and a product of an area to be observed and an etched area is observed by an optical microscope, one piece of defect for each agglutinate of a flaw pattern (vacancy-type point defect) and a dislocation cluster (interstitial silicon-type point defect) is detected with reference to an inspected volume such as $1 \times 10^{-3}$/cm$^3$.

The thermal processing operation is performed to this silicon wafer W within a temperature range such as 600° C. to 950° C. (here, the temperature should not be greater than 950° C.) in an atmospheric gas which is formed by a hydrogen gas or an inert gas or a mixture gas of these gases. Here, for example, an argon gas (Ar) or a nitrogen gas ($N_2$) are used for the above inert gas.

This thermal processing operation is an RTA processing operation in which a rapid heating operation and a rapid cooling operation (for example, 10° C./sec. of temperature increase and decrease) are performed, for example, for a period such as 1 to 300 seconds. In the present embodiment, a thermal processing operation is performed in a hydrogen gas atmosphere at 900° C. for 10 seconds.

By performing this thermal processing operation, the oxide film which is formed on a surface of the silicon wafer W is removed; thus, a defect on a surface of the silicon wafer W disappears because the silicon atom on a surface further moves.

Here, the silicon atom on a surface of the silicon wafer W can move easily even in the thermal processing operation which is performed in a relatively low temperature condition such as 600° C. to 950° C. (here, the temperature should not be greater than 950° C.) under condition that an oxide film does not exist on the surface.

Furthermore, the temperature for the above thermal processing operation is 600° C. or higher; therefore, it is possible to remove the oxide film on a surface of the silicon wafer W and move the silicon atom on the surface reliably.

On the other hand, the temperature for the thermal processing operation is not higher than 950° C.; therefore, a metal contamination is hardly generated because of the thermal processing device 1 on the silicon wafer. Also, it is possible to restrict a deterioration of the background level of the reflected light which is measured by the particle counter.

Furthermore, the temperature for the thermal processing operation is performed in a low temperature; therefore, the oxygen precipitated nuclei in the silicon wafer W hardly disappears; thus, it is possible to restrict a reduction in the BMD density after performing the thermal processing operation to the device.

Also, this thermal processing operation is maintained at least for 1 (one) second for securing a time for moving the silicon atom on a surface of the silicon single-crystal layer by the thermal processing operation. By doing this, it is possible to remove the oxygen film on the surface of the silicon wafer W and moving the silicon atom reliably.

It is preferable that a time for performing this thermal processing operation should be not longer than 300 seconds for realizing an improved effect and productivity.

Furthermore, an oxygen film is formed on a surface of this silicon wafer W by performing the thermal processing operation in an oxygen ($O_2$) gas atmosphere at a temperature which is not greater than 950° C.; thus, it is possible to obtain a silicon wafer of which surface quality is improved.

A device is formed on this silicon wafer by layering in a predetermined pattern after performing a photolithography step and an etching step, etc., on various films on the oxide film.

The GOI never decreases on the silicon wafer according to the present invention of which surface quality is improved even if a cleaning liquid or an etchant is used thereafter.

Therefore, defect quality may not occur on the device which is formed on a surface of the silicon single-crystal layer thereafter; thus, it is possible to improve the product yield.

Here, a technical range of the present invention is not limited to the above embodiment; thus, various modification can be added unless deviating effects and structures of the present invention. For example, in the above embodiment, it is acceptable if a heating operation may be performed by using other ray (visible ray, etc.) while the silicon wafer W is heated by emitting an infra-red ray by using an infra-red ray lamp 3 for performing a heating operation for the silicon wafer W. Also, it is acceptable if a conventional electric furnace may be used in place of an RTA furnace such as the above thermal processing device 1.

EXAMPLES

Here, tests and inspections are performed as follows in order to examine a difference for a quality of the surface according to a condition for the thermal processing operation which is performed to a silicon single-crystal layer.

In the following tests and inspections, a member is used which is formed by preparing a plurality of silicon single-crystal layers which is formed by performing a thermal processing operations to silicon single-crystal layers which have approximately the same quality for different period of times for the thermal processing operation, performing an etching operation and a cleaning operation to these silicon single-crystal layers under the same condition, further performing a thermal processing operation at 900° C. of temperature in an oxygen ($O_2$) gas atmosphere so as to form an oxygen film which has 9 nm thickness.

Here, in the following tests and inspections, a silicon wafer is used for a silicon single-crystal layer which is manufactured by modifying an ingot of the silicon single-crystal which is grown while being pulled according to the CZ method. A hydrogen gas is used for an atmosphere gas for the thermal processing operation. Also, an etchant is used such that a relationship such as $H_2O$ (water): HF (hydrofluoric acid)=50:1 is effective. A cleaning liquid is used such that a relationship such as $NH_4OH$: $H_2O_2$:$H_2O$=1:1:5 is effective.

[Test for a Pressure Resistance for an Oxygen Film]

In this test, a poly-silicon electrode which has 0.5 μm longitude and 0.5 μm latitude is formed on a surface of each silicon single-crystal layer to which different temperature and time of thermal processing operations are performed in the above thermal processing operation in a photolithography step; thus, a pressure resistance performance of the poly-silicon electrode of each silicon single-crystal layer is examined. That is, a pressure resistance performance of an oxygen film on a surface of the silicon single-crystal layer is examined.

Here, a plurality of poly-silicon electrodes are patterned by a pattern of 5 mm×4 mm on a surface of each silicon single-crystal layer so as to charge a voltage onto each poly-silicon electrode. This charged voltage increases gradually in a step manner after it is started to be charged such that maximum 1 mA of stress (which is equivalent to 11 MV/cm$^2$ of an electric field strength) is charged to each poly-silicon electrode.

After the voltage is charged in this way, a ratio of unbroken poly-silicon electrode is an inspected product ratio (%) among a total number of the poly-silicon electrodes which are formed on the silicon single-crystal layer.

Consequently, the inspected product ratio for each of the silicon single-crystal layer of which temperature for the thermal processing operation is different under condition that the time for the thermal processing operation is the same (60 seconds) is calculated; thus, a dependency of the inspected product ratio is calculated with reference to the RTA processing temperature. The result is shown in a graph in FIG. 3.

Figure 4:
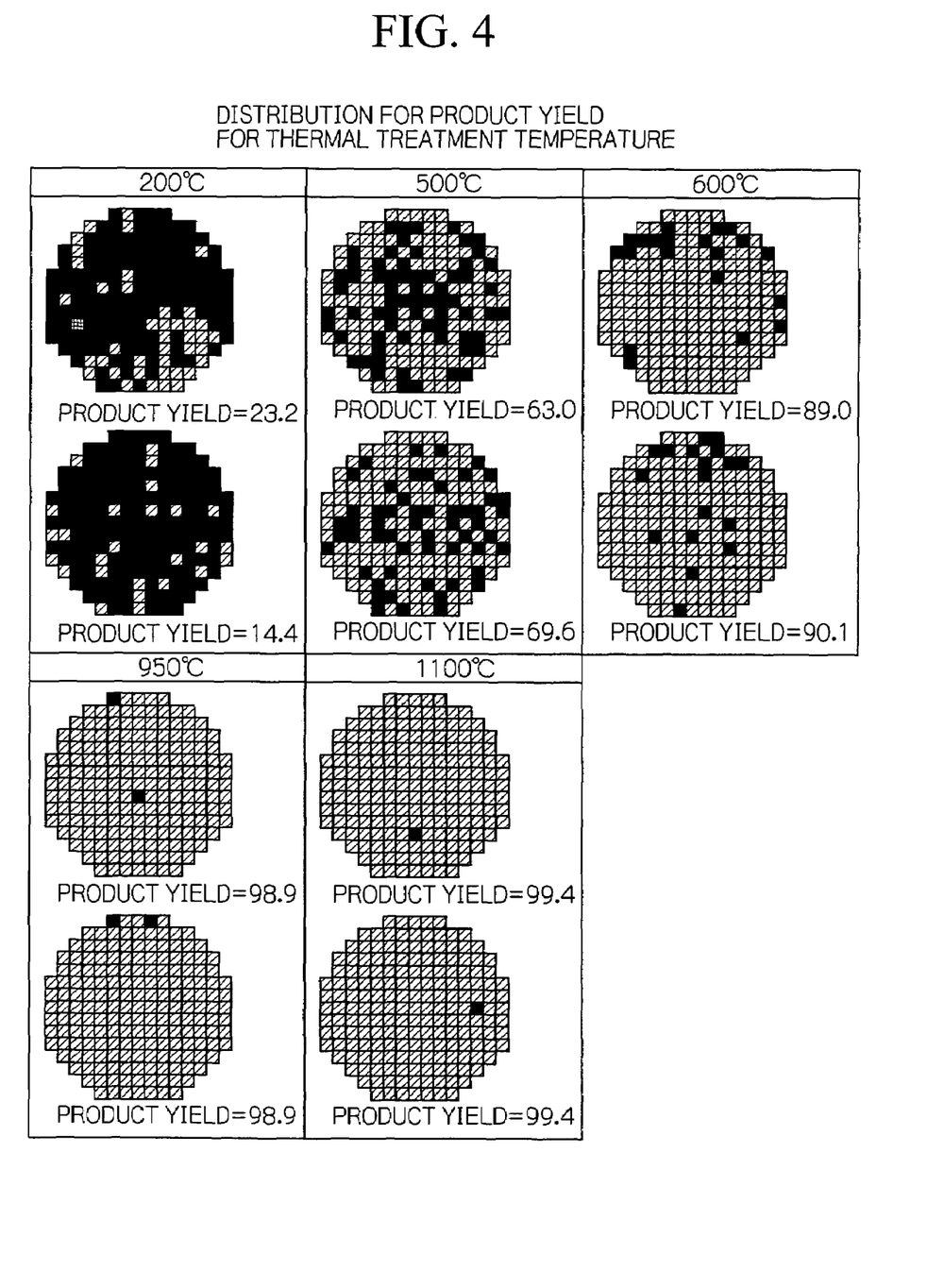
FIG. 4 is a view for showing a distribution of a product yield for a pressure-resistance performance for a polysilicon electrode which is formed on a surface in a plurality of the silicon single-crystal layers of which RTA processing temperature are different.

Also, two pieces of silicon single-crystal layers of which temperature for the thermal processing operation is different are prepared for each temperature for the thermal processing operation under condition that the time for the thermal processing operation is the same (60 seconds) such that a distribution of the inspected products regarding the pressure resistance performance of the poly-silicon electrode which is formed on the surface of each of the silicon single-crystal layer is calculated. The result is shown in FIG. 4. In FIG. 4, a lattice on a surface of the silicon single-crystal layer indicates a pattern (poly-silicon electrode) respectively such that a while lattice indicates an inspected product and a black lattice indicates a defect product.

Figure 3:
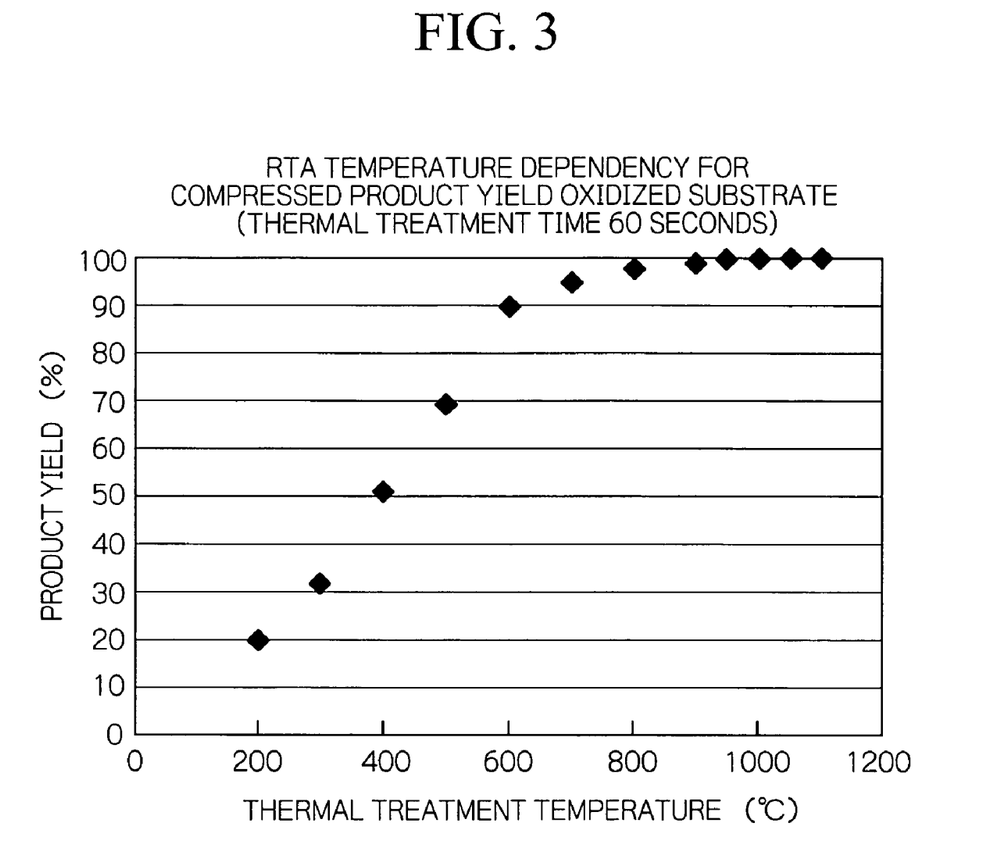
FIG. 3 is a graph for showing a dependency of a product yield with reference to an RTA processing temperature which is performed to the silicon single-crystal layer.

As shown in FIGS. 3 and 4, it is understood that, if the temperature for the thermal processing operation is lower than 600° C., the defect product ratio is high evidently. If the temperature for the thermal processing operation is higher than 600° C., it is understood that the ratio for the inspected product improves approximately 90% or higher.

Due to this, it is understood that the performance of the pressure resistance in the oxygen film in which an HF etching operation is performed decreases in the silicon single-crystal layer of which temperature for the thermal processing operation is lower than 600° C. or lower, and if the temperature for the thermal processing operation is 600° C. or higher, the performance of the pressure resistance in the oxygen film does not decreases.

Also, a plurality of silicon single-crystal layers are prepared in which the temperature for the thermal processing operation is the same (900° C.) and only the time for the thermal processing operation is different such that the above explained pressure resistance test is performed to the poly-silicon electrode which is formed on a surfaces of these silicon single-crystal layers; thus, a dependency of the inspected product ratio is calculated with reference to the time for the thermal processing operation. The result is shown in a graph in FIG. 5.

Figure 5:
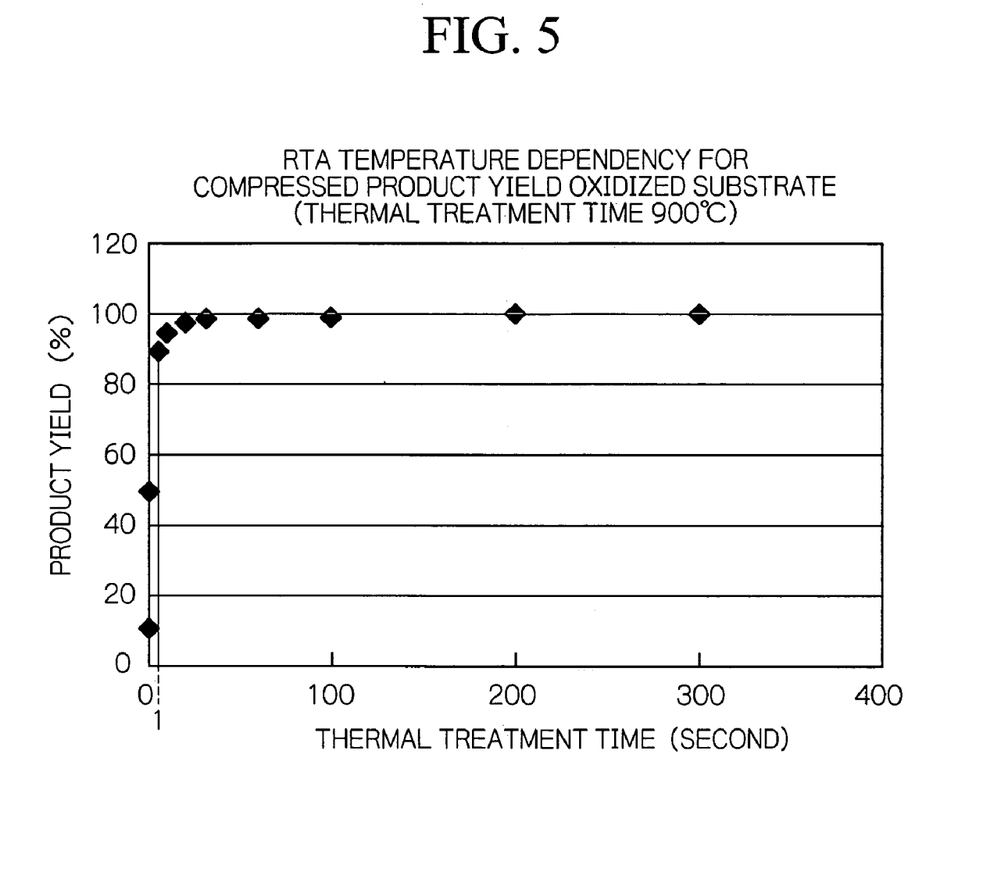
FIG. 5 is a graph for showing a dependency of a product yield with reference to an RTA processing time which is performed to the silicon single-crystal layer.

According to FIG. 5, it is understood that an effect for improving a quality of a surface of the silicon monocryatal layer high even for a short period of time such as 1 (one) second for the thermal processing operation.

[Surface Inspection]

Next, an Fe contamination level for a surface of the silicon single-crystal layer is measured according to an SPV (Surface Photo Voltage measurement) for each silicon single-crystal layer of which time for performing the thermal processing operation is the same (60 seconds) and the temperature for the thermal processing operation is different so as to examine the dependency of the Fe contamination level with reference to the temperature for the thermal processing operation. The result is shown in a graph in FIG. 6.

Figure 6:
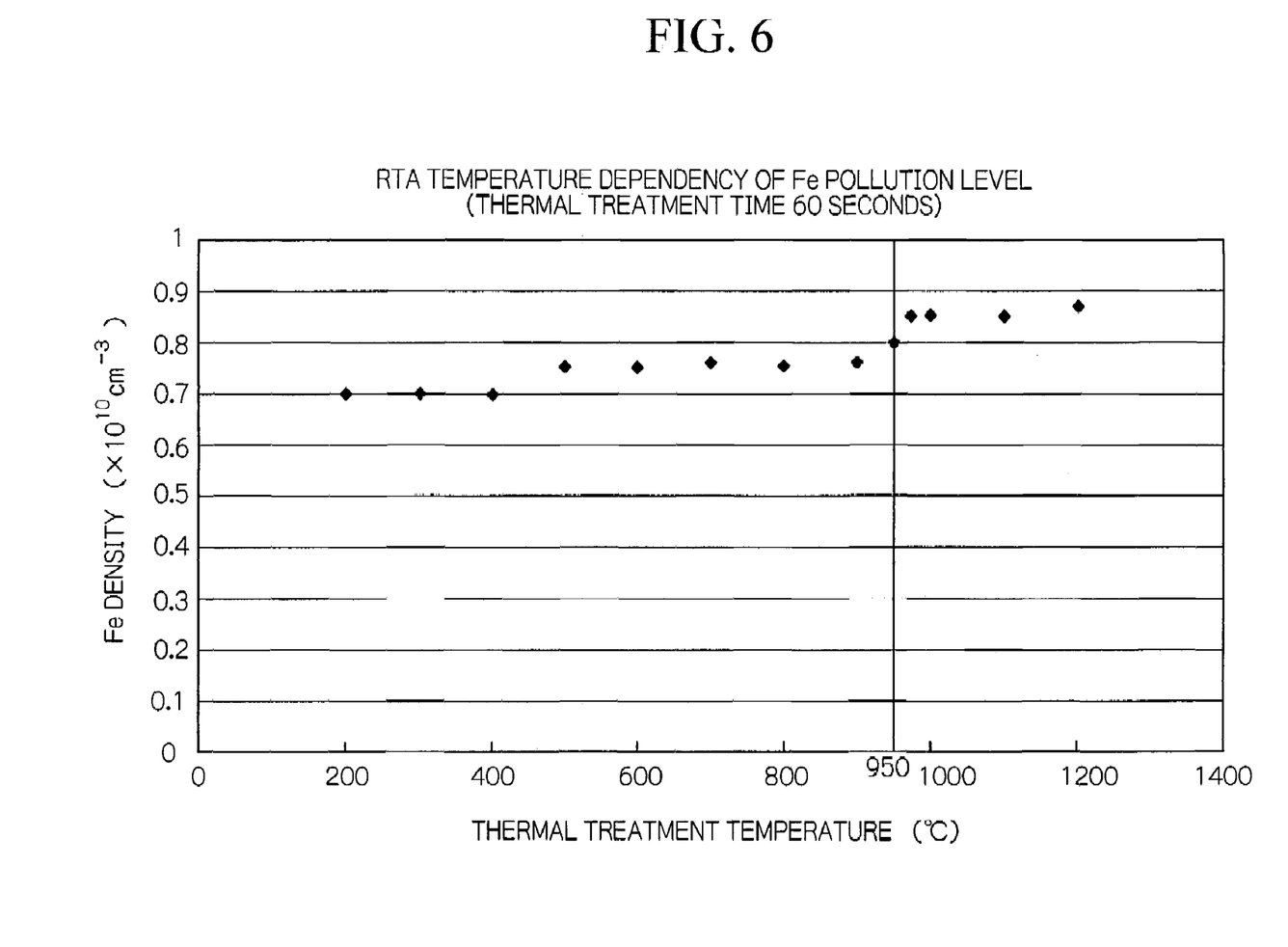
FIG. 6 is a graph for showing a dependency of an Fe contamination level with reference to a thermal processing temperature which is performed to the silicon single-crystal layer.

According to FIG. 6, it is understood that if the temperature for the thermal processing operation is in a range of 600° C. to 950° C., the Fe contamination level is almost constant, and in contrast, if the temperature for the thermal processing operation is 950° C. or higher, the Fe contamination level increases with compared to a case in which the temperature for the thermal processing operation is not greater than 950° C.

Furthermore, an intensity of a scattered light on a surface of the silicon single-crystal layer is measured by a particle counter for these silicon monocryatal layer so as to calculate the haze level (background level). Thus, the dependency of the haze level with reference to the temperature for the thermal processing operation is shown. The result is shown in a graph in FIG. 7.

Figure 7:
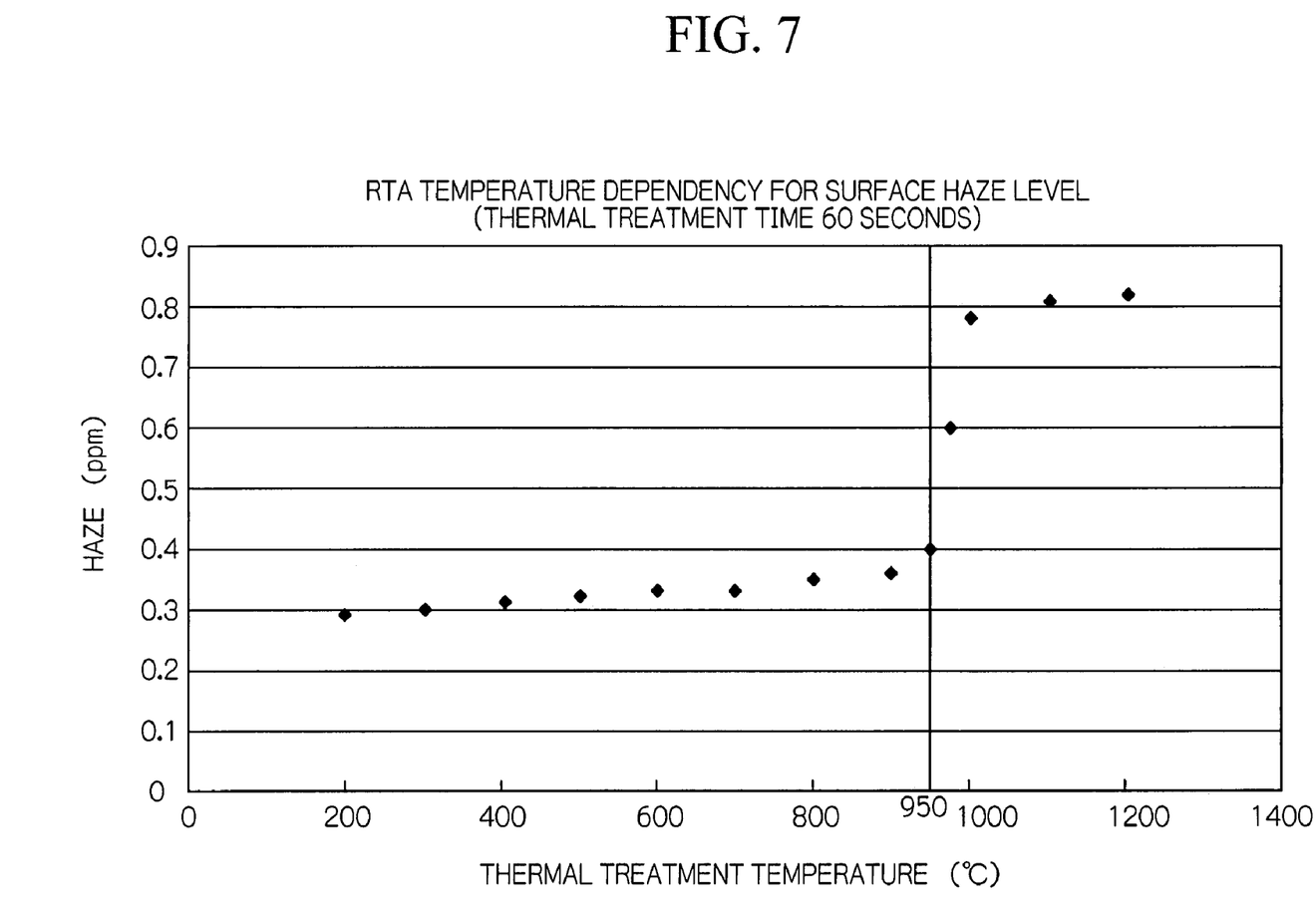
FIG. 7 is a graph for showing a dependency of a haze level (background level) which is measured by a particle counter with reference to an RTA processing temperature which is performed to the silicon single-crystal layer.

According to FIG. 7, it is understood that, if the temperature for the thermal processing operation is not greater than 950° C., the haze level increases very gradually while the temperature for the thermal processing operation increases. In contrast, if the temperature for the thermal processing operation is 950° C. or higher, the haze level increases rapidly. Thus, it is understood that there is an evident difference on a surface condition of the silicon single-crystal layer between a case in which the temperature of the thermal processing operation is not greater than 950° C. and a case in which the temperature of the thermal processing operation is 950° C. or higher.

[Measurement for BMD Density]

Next, a secco etching operation is performed for each silicon single-crystal layer of which temperature for the thermal processing operation is the same (60 seconds) and the temperature for the thermal processing operation is different in the above thermal processing operation; thus, a BMD density in the silicon single-crystal layer is observed. The result is shown in FIG. 8.

In this measurement, a silicon wafer is used for a silicon single-crystal layer in which a thermal processing operation is performed for 4 hours at 800° C. of the thermal processing operation temperature before the above thermal processing operation and an additional 16 hours of thermal processing operation is performed at 1000° C. so as to form the DZ on the surface layer and the BMD thereinside.

Figure 8:
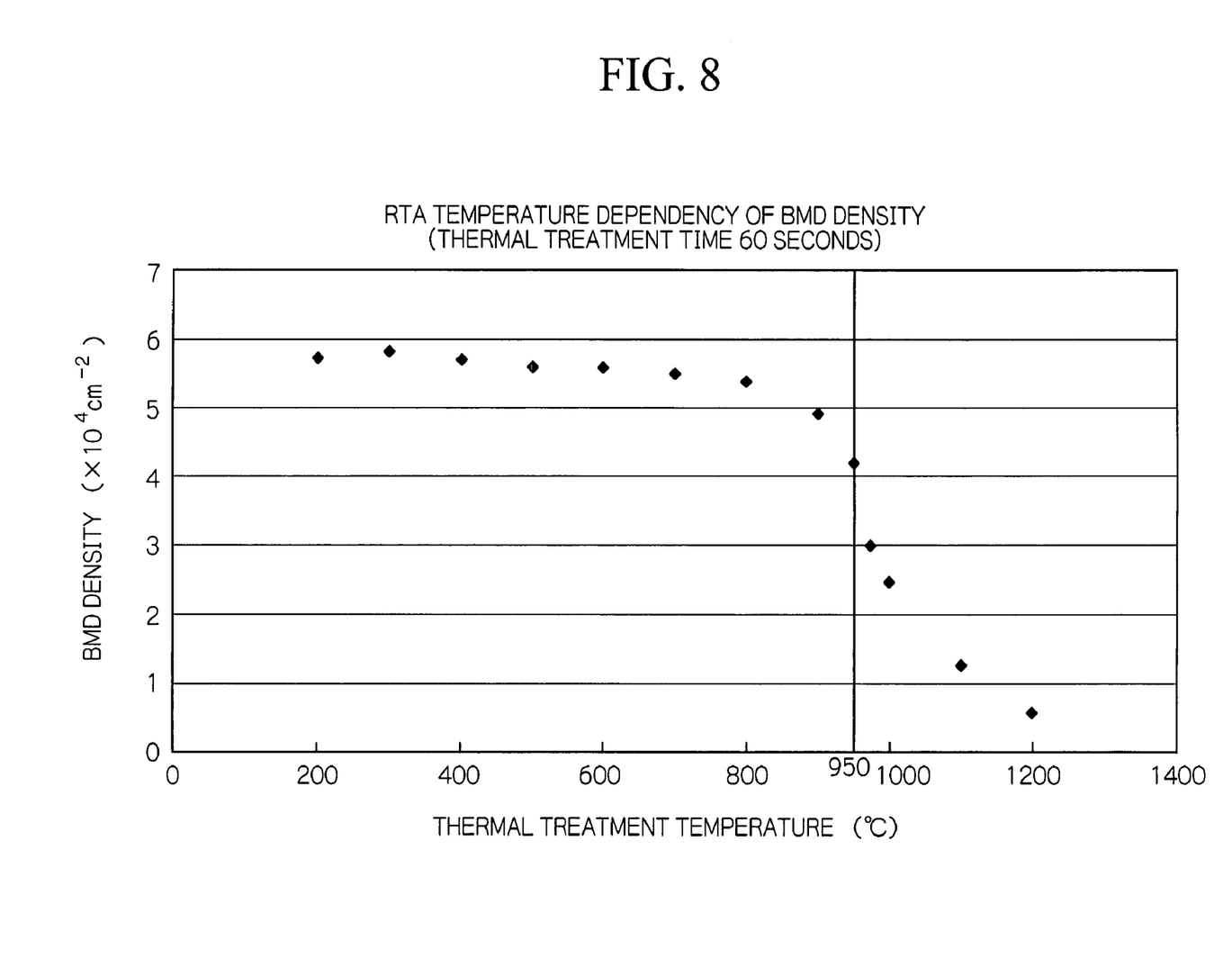
FIG. 8 is a graph for showing a dependency of a BMD density in the silicon single-crystal layer with reference to an RTA processing temperature which is performed to the silicon single-crystal layer.

According to FIG. 8, it is understood that if the temperature for the thermal processing operation is not greater than 950° C., the BMD density decreases gradually in the silicon single-crystal layer while the temperature for the thermal processing operation increases. Consequently, it is understood that, if the temperature for the thermal processing operation is 950° C. or higher, the BMD density decreases rapidly.

It is understood that it is possible to manufacture the silicon single-crystal layer in which a resistance to the cleaning liquid and the enchant is high and a pressure resistance of the oxygen film is desirable by setting the temperature for the thermal processing operation for manufacturing the silicon single-crystal layer in a range of 600° C. to 950° C. (here, the temperature should not be greater than 950° C.) according to a pressure resistance performance of the oxygen film, the Fe contamination level, the background (haze) level which is measured by the particle counter, an amount of the BMD which remains in the silicon single-crystal layer which are obtained in the above explained tests and examinations.

Next, an examination is performed for a difference of a surface quality of the silicon wafer in a similar manner to the above tests for both of the silicon wafer which is used in the above explained wafer to which the above thermal processing operation and furthermore a finishing grinding operation and a cleaning operation are performed and a silicon wafer which is used in the above explained tests to which a finishing grinding operation, a cleaning operation, and furthermore the above explained thermal processing operation are performed.

Here, two silicon wafers in which a finishing grinding operation and a cleaning operation are performed after a thermal processing operation are prepared such as a member in which the above thermal processing operation is performed over 800° C. (hereinafter called an example 1) and a member in which the above thermal processing operation is performed at 800° C. of temperature or lower (hereinafter called an example 2). Also, two silicon wafers in which, after the finishing grinding operation and the cleaning operation performed, the above thermal processing operation is performed, are prepared such as a member in which the above thermal processing operation is performed over 800° C. (hereinafter called an example 3) and a member in which the above thermal processing operation is performed at 800° C. of temperature or lower (hereinafter called an example 4). Also, these silicon wafers are cleaned by the same cleaning liquid as used in the above tests.

The pressure resistance test for the oxygen film, a surface test, and the BMD density measurement are performed for these examples 1 to 4. Here, it is possible to confirm that the example 2 has a more desirable quality than the example 1, the example 3 has more desirable quality than these examples 1 and 2, and the example 4 has the most desirable quality among these examples.

According to these facts, if the above thermal processing operation for the DK thermal processing operation, it is preferable to perform the above thermal processing operation after performing the finishing grinding operation and the cleaning operation on the silicon single-crystal layer for obtaining a higher quality silicon single-crystal layer, and it is understood that it is possible to obtain a further higher quality silicon single-crystal layer by setting the temperature for the thermal processing operation at 800° C. or lower.

INDUSTRIAL APPLICABILITY

According to the present invention, following effects can be realized.

According to a method for manufacturing the silicon single-crystal layer according to the present invention, a thermal processing operation is performed to the silicon single-crystal layer in an atmosphere gas which is formed by a hydrogen gas or an inert gas or a mixture gas of these gases at a temperature which is in a range of 600° C. and 950° C. (here, the temperature should not be greater than 950° C.). Therefore, the oxygen film on a surface of the silicon single-crystal layer is removed and a silicon atom on a surface moves; thus, the defect on a surface disappears. Therefore, it is possible to improve a quality of the surface of the silicon single-crystal layer.

By doing this, it is possible to manufacture the silicon single-crystal layer according to the present invention in which a metal contamination is restricted on a surface of the silicon single-crystal layer and a background level is restricted during the measurement by the particle counter, and furthermore the BMD density is restricted from decreasing the silicon single-crystal layer such that a resistance for the cleaning liquid and the etchant is high.

Therefore, the method for manufacturing the silicon single-crystal layer is preferable for a wafer of which diameter is required to be larger. In particular, the method for manufacturing the silicon single-crystal layer is effective for a wafer of which diameter is 300 mm which is larger than 200 mm.

The invention claimed is:

1. A method for manufacturing a silicon single-crystal layer comprising:
    performing a thermal processing operation in which a thermal annealing operation is performed for 1 to 30 seconds time in an atmospheric gas that is formed by a hydrogen gas, an inert gas, or a mixture gas of these gases in a temperature of 600° C. to 950° C.

2. A method for manufacturing a silicon single-crystal layer according to claim 1, wherein the silicon single-crystal layer to which the thermal processing operation is performed is formed by a silicon wafer in which an agglutinate that is cut from an ingot which is formed by a perfect area does not exist under condition that an area indicated by an interstitial silicon point defect exists in an ingot of the silicon single-crystal dominantly, an area indicated as a vacancy point defect exists dominantly, a perfect area indicated by the agglutinate of the interstitial silicon point defect and the agglutinate of a point defect do not exist.

3. A method for manufacturing a silicon single-crystal layer according to claim 1, wherein the thermal processing operation is performed after performing a grinding processing operation for the silicon single-crystal layer.

4. A method for manufacturing a silicon single-crystal layer according to claim 3 wherein the thermal processing operation is performed at a temperature 600° C. to 800° C.

5. A silicon single-crystal layer which is manufactured by a method for manufacturing a silicon single-crystal layer according to claim 1.

* * * * *